United States Patent
Shoji et al.

(10) Patent No.: US 8,123,111 B2
(45) Date of Patent: Feb. 28, 2012

(54) PRODUCTION METHOD OF SOLDER CIRCUIT BOARD

(75) Inventors: Takashi Shoji, Tokyo (JP); Takekazu Sakai, Tokyo (JP); Tetsuo Kubota, Chichibu (JP)

(73) Assignee: Showa Denko K.K., Tokyo (JP)

( * ) Notice: Subject to any disclaimer, the term of this patent is extended or adjusted under 35 U.S.C. 154(b) by 739 days.

(21) Appl. No.: 11/910,256

(22) PCT Filed: Mar. 28, 2006

(86) PCT No.: PCT/JP2006/307006
§ 371 (c)(1),
(2), (4) Date: Sep. 19, 2008

(87) PCT Pub. No.: WO2006/104238
PCT Pub. Date: Oct. 5, 2006

(65) Prior Publication Data
US 2009/0056977 A1    Mar. 5, 2009

Related U.S. Application Data

(60) Provisional application No. 60/668,611, filed on Apr. 6, 2005.

(30) Foreign Application Priority Data
Mar. 29, 2005    (JP) ................. 2005-094622

(51) Int. Cl.
*B23K 31/02* (2006.01)
*C23C 20/04* (2006.01)

(52) U.S. Cl. ................................... 228/248.1

(58) Field of Classification Search .......... None
See application file for complete search history.

(56) References Cited

U.S. PATENT DOCUMENTS

| | | |
|---|---|---|
| 4,081,576 A | 3/1978 | Hensel et al. |
| 4,572,103 A | 2/1986 | Engel |
| 4,777,804 A | 10/1988 | Bowling et al. |
| 4,872,928 A | 10/1989 | Jacobs |
| 5,205,439 A | 4/1993 | Sturm |
| 5,277,333 A | 1/1994 | Shimano |
| 5,339,842 A | 8/1994 | Bok |

(Continued)

FOREIGN PATENT DOCUMENTS

CN    1168195 A    12/1997

(Continued)

OTHER PUBLICATIONS

TW Notification for the Opinion of Examination, dated Jul. 23, 2009, issued in corresponding TW Application No. 095110694, 25 pages in English and Chinese.

(Continued)

*Primary Examiner* — Kiley Stoner
(74) *Attorney, Agent, or Firm* — Sughrue Mion, PLLC

(57) ABSTRACT

A method for producing a solder circuit board includes imparting tackiness to a surface of a conductive circuit electrode provided on a printed wiring board to form a tackiness-imparted area, depositing solder powder on the tackiness-imparted area and heating the printed wiring board so as to melt the solder to thereby form a solder circuit. The solder powder is placed in a vessel. The printed wiring board having the electrode whose surface has been imparted with tackiness is placed in the vessel. The vessel is tilted to thereby deposit the solder powder on the tackiness-imparted area.

7 Claims, 1 Drawing Sheet

U.S. PATENT DOCUMENTS

| | | | |
|---|---|---|---|
| 5,346,118 | A | 9/1994 | Degani et al. |
| 5,506,385 | A | 4/1996 | Murakami et al. |
| 5,556,023 | A | 9/1996 | Kuramoto et al. |
| 5,593,504 | A | 1/1997 | Cala et al. |
| 5,653,820 | A | 8/1997 | Higashino |
| 5,674,326 | A | 10/1997 | Wrezel et al. |
| 5,713,997 | A | 2/1998 | Kuramoto et al. |
| 5,750,271 | A * | 5/1998 | Kuramoto et al. ............ 428/624 |
| 5,787,878 | A | 8/1998 | Farooq et al. |
| 5,922,978 | A | 7/1999 | Carroll |
| 5,928,440 | A | 7/1999 | Kuramoto et al. |
| 5,960,251 | A | 9/1999 | Brusic et al. |
| 5,972,051 | A | 10/1999 | Leroux et al. |
| 5,976,965 | A | 11/1999 | Takahashi et al. |
| 6,066,551 | A | 5/2000 | Satou et al. |
| 6,070,788 | A * | 6/2000 | Zakel ............................ 228/214 |
| 6,126,865 | A | 10/2000 | Haak et al. |
| 6,169,022 | B1 | 1/2001 | Saitou |
| 6,214,636 | B1 | 4/2001 | Sawayama et al. |
| 6,219,910 | B1 | 4/2001 | Murali |
| 6,239,013 | B1 | 5/2001 | Hotchkiss |
| 6,249,963 | B1 | 6/2001 | Chou et al. |
| 6,264,093 | B1 | 7/2001 | Pilukaitis et al. |
| 6,273,100 | B1 | 8/2001 | Andreas et al. |
| 6,423,154 | B1 | 7/2002 | Van Gerven et al. |
| 6,468,582 | B1 | 10/2002 | Sakemi |
| 6,518,163 | B2 | 2/2003 | Sakuyama et al. |
| 6,551,650 | B1 | 4/2003 | Carre et al. |
| 6,871,776 | B2 | 3/2005 | Trucco |
| 6,886,733 | B2 | 5/2005 | Katayama |
| 6,982,484 | B2 | 1/2006 | Ogura et al. |
| 2001/0008160 | A1 | 7/2001 | Suzuki et al. |
| 2001/0020744 | A1* | 9/2001 | Kuramoto et al. ............ 257/738 |
| 2001/0024704 | A1 | 9/2001 | Otsuki et al. |
| 2002/0000462 | A1 | 1/2002 | Mead et al. |
| 2002/0124646 | A1 | 9/2002 | Mokuo |
| 2002/0148881 | A1 | 10/2002 | Trucco |
| 2003/0007136 | A1 | 1/2003 | Emoto et al. |
| 2003/0019918 | A1 | 1/2003 | Farooq et al. |
| 2003/0029908 | A1 | 2/2003 | Suzuki et al. |
| 2003/0037804 | A1 | 2/2003 | Erdmann |
| 2003/0089891 | A1 | 5/2003 | Andreas |
| 2003/0091789 | A1 | 5/2003 | Koskenmaki et al. |
| 2003/0127501 | A1* | 7/2003 | Cheng et al. ................. 228/246 |
| 2003/0209585 | A1 | 11/2003 | Katayama |
| 2003/0213905 | A1 | 11/2003 | Lennon et al. |
| 2003/0221748 | A1 | 12/2003 | Arzadon et al. |
| 2003/0236362 | A1 | 12/2003 | Bluem et al. |
| 2004/0124230 | A1 | 7/2004 | Hertz et al. |
| 2004/0135251 | A1 | 7/2004 | Tellkamp et al. |
| 2004/0146659 | A1 | 7/2004 | Bednarz et al. |
| 2004/0250919 | A1 | 12/2004 | Saito et al. |
| 2004/0251561 | A1 | 12/2004 | Wilson et al. |
| 2005/0184129 | A1 | 8/2005 | Godijn et al. |
| 2005/0207930 | A1 | 9/2005 | Yamaguchi |
| 2005/0274770 | A1* | 12/2005 | Henderson, Sr. ............... 228/41 |
| 2006/0043543 | A1 | 3/2006 | Wada et al. |
| 2006/0043597 | A1 | 3/2006 | Wada et al. |
| 2006/0270575 | A1 | 11/2006 | Kim et al. |
| 2007/0086147 | A1 | 4/2007 | Kawamura et al. |
| 2007/0090160 | A1 | 4/2007 | Masumoto |
| 2007/0145103 | A1 | 6/2007 | Bednarz et al. |
| 2007/0215172 | A1 | 9/2007 | Watanabe et al. |
| 2007/0284136 | A1* | 12/2007 | Sakai et al. ................... 174/255 |
| 2007/0292988 | A1 | 12/2007 | Nakabayashi |
| 2008/0173699 | A1 | 7/2008 | Shoji et al. |
| 2009/0041990 | A1 | 2/2009 | Shoji et al. |
| 2009/0261148 | A1 | 10/2009 | Shoji et al. |
| 2010/0009070 | A1 | 1/2010 | Shoji et al. |
| 2010/0038411 | A1 | 2/2010 | Shoji et al. |

FOREIGN PATENT DOCUMENTS

| | | |
|---|---|---|
| DE | 4340396 A1 | 6/1995 |
| DE | 19535622 C1 | 9/1996 |
| EP | 0 595 343 A2 | 5/1994 |
| EP | 1 569 503 A1 | 8/2005 |
| JP | 1318280 A | 12/1989 |
| JP | 02-012830 A * | 1/1990 |
| JP | 03-000152 A | 1/1991 |
| JP | 04-051521 A * | 2/1992 |
| JP | 5-048258 A | 2/1993 |
| JP | 54-008258 A | 2/1993 |
| JP | 5-160095 A | 6/1993 |
| JP | 5-255876 A | 10/1993 |
| JP | 06-045740 A | 2/1994 |
| JP | 06-344132 A * | 12/1994 |
| JP | 7-094853 A | 4/1995 |
| JP | 07-212022 A | 8/1995 |
| JP | 07-007244 A | 10/1995 |
| JP | 07-288255 A | 10/1995 |
| JP | 08-018222 A | 1/1996 |
| JP | 9-001382 A | 1/1997 |
| JP | 09-199506 A | 7/1997 |
| JP | 11-8272 A | 1/1999 |
| JP | 11-121907 A | 4/1999 |
| JP | 11-240612 A | 9/1999 |
| JP | 2000-082873 A | 3/2000 |
| JP | 2001-311005 A | 11/2001 |
| JP | 2002-076062 A | 3/2002 |
| JP | 2002-257516 A | 9/2002 |
| JP | 2003-037217 A | 2/2003 |
| JP | 2003-332375 A | 11/2003 |
| JP | 2004-087756 A * | 3/2004 |
| JP | 2005-011884 A | 1/2005 |
| JP | 2005-174828 A | 6/2005 |
| JP | 2005-354043 A | 12/2005 |
| JP | 2006-136935 A | 6/2006 |
| JP | 2006-278650 A | 10/2006 |
| JP | 2006-351559 A | 12/2006 |
| JP | 2007-073869 A | 3/2007 |
| KR | 10-0315763 | 2/2002 |
| TW | 472513 | 1/2002 |
| TW | 590880 B | 6/2004 |
| TW | 594891 | 6/2004 |
| TW | 200507707 A | 2/2005 |
| WO | 8600842 A1 | 2/1986 |
| WO | 0205607 A1 | 1/2002 |
| WO | 2005/109977 A1 | 11/2005 |
| WO | 2006/104238 A1 | 10/2006 |
| WO | 2007/029866 A1 | 3/2007 |

OTHER PUBLICATIONS

Powder Technology Handbook, $2^{nd}$ Ed., edited by Society of Powder Technology, Japan, 1998, pp. 19-20, published by The Nikkan Kogyo Shimbun, Ltd., Tokyo, Japan.

Chinese Application No. 2007800327321.9 Office Action dated Sep. 27, 2010 citing the listed CN1168195.

Supplementary European Search Report for EP 07 79 1891 dated Apr. 23, 2010 citing the listed DE19535622.

* cited by examiner

F I G. 1
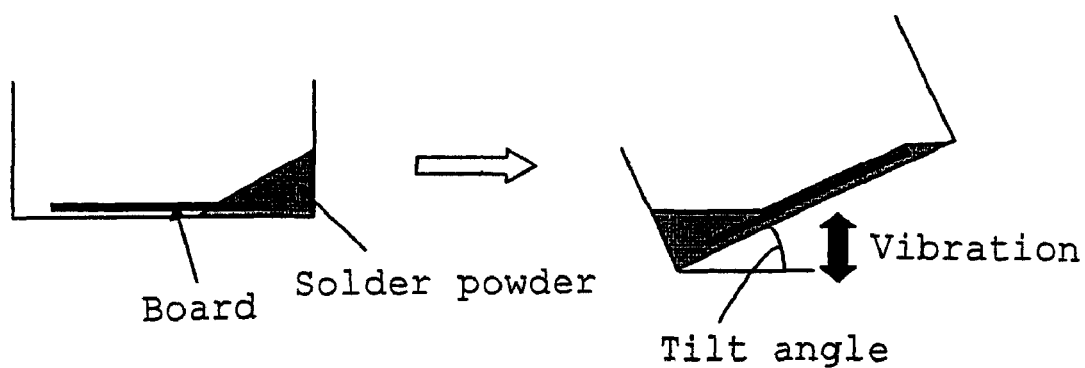

PRODUCTION METHOD OF SOLDER CIRCUIT BOARD

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/668,611 filed Apr. 6, 2005 and Japanese Patent Application No. 2005-094622 filed Mar. 29, 2005 pursuant to 35 U.S.C. §111(b).

TECHNICAL FIELD

The present invention relates to a method for producing a solder circuit board, and more particularly, to a method for forming a solder layer on a conductive circuit micro-electrode provided on a printed wiring board.

BACKGROUND ART

In recent years, there have been developed printed wiring boards, in which a circuit pattern is formed on an insulating substrate, such as a plastic substrate, a ceramic substrate or a metallic substrate having thereon a coating layer formed from plastic or the like. Formation of an electronic circuit from such a printed wiring board typically employs a technique of soldering electronic parts, such as IC elements, semiconductor chips, resistors and capacitors, onto the circuit pattern.

When such a technique is employed, the process for joining a lead terminal of an electronic part to a predetermined area of the circuit pattern typically proceeds as follows: forming in advance a solder thin layer on a surface of a conductive circuit electrode provided on the substrate; applying a solder paste or a flux through printing; positioning and placing an electronic part of interest; and reflowing the solder thin layer or both the solder thin layer and the solder paste.

In a recent trend for the miniaturization of electronic products, demand has arisen for fine-pitch patterning of solder circuit boards. On such solder circuit boards, fine-pitch parts such as a 0.3-mm-pitch QFP (Quad Flat Package)-type LSI and CSP (Chip Size Package) and a 0.15-mm-pitch FC (Flip Chip) are mounted. Thus, solder circuit boards are required to have a minute solder circuit pattern which allows fine-pitch mounting.

When a solder circuit is formed on a printed wiring board by use of solder film, a method such as plating, the hot air leveler (HAL) method or a combination of printing solder powder paste and reflowing is employed. However, plating has a drawback in that a thick solder layer is difficult to form, and the HAL method and printing of solder paste encounter difficulty in provision of fine-pitch patterns.

In order to overcome the aforementioned drawbacks, a method for forming a solder circuit without requiring cumbersome operations such as positioning of a circuit pattern is disclosed (see, for example, JP-A HEI 7-7244). In the method, a surface of a conductive circuit electrode provided on a printed wiring board is reacted with a tackiness-imparting compound so as to impart tackiness to the surface, solder powder is deposited on the thus formed tacky area, and the printed wiring board is heated so as to melt the solder, whereby a solder circuit is formed.

Employment of the method disclosed in JP-A HEI 7-7244 enables a minute solder circuit pattern to be formed through a simple operation, thereby providing a circuit board with high reliability. However, since the method includes depositing solder powder on a circuit board under dry conditions, the solder powder may be deposited on an undesired area or may fly off due to static electricity, impeding formation of a fine-pitch circuit board, and, problematically, the solder powder cannot be efficiently utilized. These problems are more detrimental particularly when solder micro-powder is employed.

In an attempt to solve the aforementioned problems, an object of the present invention is to provide, on the basis of the method disclosed in JP-A HEI 7-7244 for producing a solder circuit board in which a surface of a conductive circuit electrode provided on a printed wiring board is reacted with a tackiness-imparting compound so as to impart tackiness to the surface, solder powder is deposited on the thus formed tacky area, and the printed wiring board is heated so as to melt the solder, whereby a solder circuit is formed, a method for producing a solder circuit board which allows realization of a further minute circuit pattern. Another object is to provide a solder circuit board having a minute circuit pattern and high reliability. Still another object is to provide an electronic-part-mounted electronic circuit component which realizes high reliability and high mounting density.

The present inventors have carried out extensive studies in order to solve the aforementioned problems, and have achieved the present invention. Accordingly, the present inventors have developed the following techniques through which the problems have been solved.

DISCLOSURE OF THE INVENTION

The present invention provides a method for producing a solder circuit board comprising the steps of imparting tackiness to a surface of a conductive circuit electrode provided on a printed wiring board to form a tackiness-imparted area, depositing solder powder on the tackiness-imparted area, and heating the printed wiring board so as to melt the solder to thereby form a solder circuit, wherein the solder powder is placed in a vessel, the printed wiring board having the electrode whose surface has been imparted with tackiness is placed in the vessel, and the vessel is tilted to thereby deposit the solder powder on the tackiness-imparted area.

In the above method for producing a solder circuit board, the vessel is tilted right and left so that the solder powder is brought into contact with both surfaces of the printed wiring board to thereby deposit the solder powder on the tackiness-imparted area.

The invention further provides a method for producing a solder circuit board comprising the steps of imparting tackiness to a surface of a conductive circuit electrode provided on a printed wiring board to form a tackiness-imparted area, depositing solder powder on the tackiness-imparted area, and heating the printed wiring board so as to melt the solder to thereby form a solder circuit, wherein the solder powder is placed in a vessel, the printed wiring board having the electrode whose surface has been imparted with tackiness is placed in the vessel, and the vessel is vibrated to thereby deposit the solder powder on the tackiness-imparted area.

In the above method for producing a solder circuit board, the vessel is vibrated so that the solder powder is brought into contact with both surfaces of the printed wiring board to thereby deposit the solder powder on the tackiness-imparted area.

In any one of the above methods for producing a solder circuit board, the vessel is a sealable vessel.

In any of the above methods for producing a solder circuit board, the solder powder is dispersed in a liquid in the vessel.

In the above method for producing a solder circuit board, the liquid is a deoxygenated liquid.

In any of the above methods for producing a solder circuit board, the method employs a solder powder deposition apparatus; the apparatus comprising a vessel for accommodating a solder powder and printed wiring boards, an inlet through which the printed wiring boards are introduced into the vessel, a mechanism for preventing, through tilting of the vessel, contact between the wiring boards and the solder powder during introduction of the wiring boards into the vessel, and a mechanism for tilting or vibrating the vessel in a sealed or non-sealed state; the printing wiring boards are held in an upright posture in the solder powder deposition apparatus, with the wiring boards being arranged in parallel with one another at predetermined intervals, and the vessel is tilted so as to prevent contact between the solder powder and the wiring boards, tilting of the vessel is reversed, to thereby bring the solder powder into contact with the wiring boards, and the vessel is tilted or vibrated.

The invention also provides a solder circuit board produced through any one of the above methods.

The invention also provides an electronic circuit component fabricated by incorporating, into a printed circuit board, the solder circuit board produced through any one of the above methods.

The invention further provides a solder powder deposition apparatus for employment in any one of the above methods, comprising a vessel for accommodating a solder powder and printed wiring boards, an inlet through which the printed wiring boards are introduced into the vessel in a horizontal direction, a mechanism for preventing, through tilting of the vessel, contact between the wiring boards and the solder powder during introduction of the wiring boards into the vessel, and a mechanism for tilting or vibrating the vessel in a sealed or non-sealed state.

According to the method for producing a solder circuit board of the present invention, a minute solder circuit pattern can be formed through simple operations. Particularly, even in a minute circuit pattern, short circuit between adjacent traces, which would otherwise be caused by solder metal, can be effectively prevented, whereby reliability of the solder circuit board is remarkably enhanced. The method for producing a solder circuit board of the present invention can also provide a small-size, high-reliability circuit board on which electronic parts are mounted, as well as electronics devices of excellent characteristics.

The above and other objects, characteristic features and advantages will become apparent to those skilled in the art from the description to be given herein below with reference to the accompanying drawing.

BRIEF DESCRIPTION OF THE DRAWINGS

FIG. 1 is a cross-section of a tiltable vessel of a solder powder deposition apparatus employed in Example 1.

BEST MODES FOR CARRYING OUT THE INVENTION

Examples of the printed wiring board produced according to the present invention include boards having a metal plate stacked on a plastic substrate, a plastic film substrate, a glass cloth substrate, an epoxy-impregnated paper substrate, or a ceramic substrate; and insulating boards having a metal base material coated with plastic or ceramic material, on which a circuit pattern is formed by use of a conductive substance, such as a metal. Specific examples of the pattern-formed insulating boards include single-sided printed wiring boards, double-sided printed wiring boards, multilayer printed wiring boards and flexible printed wiring boards. The present invention may also be applied to IC boards, capacitors, resistors, coils, varistors, bare chips and wafers.

According to the method for producing a solder circuit board of the present invention, for example, the surface of a conductive circuit electrode provided on the aforementioned printed wiring board is reacted with a tackiness-imparting compound to thereby impart tackiness to the electrode surface; a solder powder is deposited on the tacky area; and the printed wiring board is heated so as to melt the solder, whereby a solder circuit is formed.

No particular limitation is imposed on the conductive substance employed in the present invention for forming a circuit, and any conductive substance may be employed so long as the substance can be endowed with surface tackiness from the below-mentioned tackiness-imparting substance. Usually, copper is employed. Examples of the conductive substance include Ni, Sn, Ni—Au and solder alloy.

Examples of tackiness-imparting compounds preferably employed in the present invention include naphthotriazole derivatives, benzotriazole derivatives, imidazole derivatives, benzimidazole derivatives, mercaptobenzothiazole derivatives and benzothiazole-thiofatty acids. These tackiness-imparting compounds are particularly effective to copper. However, they can impart tackiness to other conductive substances.

In the present invention, the benzotriazole derivative is represented by formula (1):

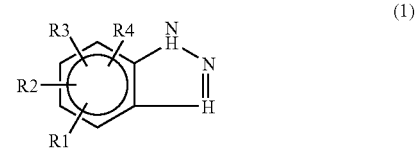

(wherein each of R1 to R4 represents a hydrogen atom, a C1 to C16, preferably C5 to C16, alkyl or alkoxy group, F, Br, Cl, I, a cyano group, an amino group or an OH group).

The naphthotriazole derivative is represented by formula (2):

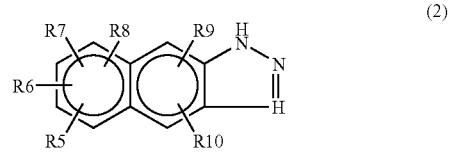

(wherein each of R5 to R10 represents a hydrogen atom, a C1 to C16, preferably C5 to C16, alkyl or alkoxy group, F, Br, Cl, I, a cyano group, an amino group or an OH group).

The imidazole derivative is represented by formula (3):

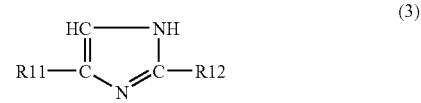

(wherein each of R11 and R12 represents a hydrogen atom, a C1 to C16, preferably C5 to C16, alkyl or alkoxy group, F, Br, Cl, I, a cyano group, an amino group or an OH group).

The benzimidazole derivative is represented by formula (4):

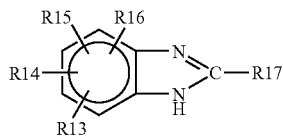

(wherein each of R13 to R17 represents a hydrogen atom, a C1 to C16, preferably C5 to C16, alkyl or alkoxy group, F, Br, Cl, I, a cyano group, an amino group or an OH group).

The mercaptobenzothiazole derivative is represented by formula (5):

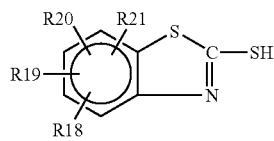

(wherein each of R18 to R21 represents a hydrogen atom, a C1 to C16, preferably C5 to C16 alkyl or alkoxy group, F, Br, Cl, I, a cyano group, an amino group, or an OH group).

The benzothiazole-thiofatty acid derivative is represented by formula (6):

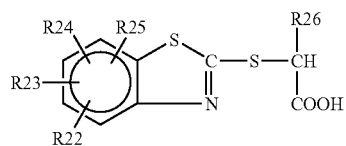

(wherein each of R22 to R26 represents a hydrogen atom, a C1 to C16, preferably C1 or C2, alkyl or alkoxy group, F, Br, Cl, I, a cyano group, an amino group or an OH group).

Among these compounds, the benzotriazole derivative represented formula (1) generally imparts stronger tackiness when R1 to R4 have more carbon atoms.

The imidazole derivative represented by formula (3) and the benzimidazole derivative represented by formula (4) generally impart stronger tackiness when R11 to R17 have more carbon atoms.

In the benzothiazole-thiofatty acid derivative represented by formula (6), each of R22 to R26 preferably has 1 or 2 carbon atoms.

In the present invention, at least one species of the aforementioned tackiness-imparting compounds is dissolved in water or an aqueous acidic solution. Preferably, the solution, in use, has a pH of about 3 to 4; i.e., a slightly acidic condition. In the case in which a metallic conductive substance is employed, examples of the substance for adjusting the pH include inorganic acids, such as hydrochloric acid, sulfuric acid, nitric acid and phosphoric acid. Alternatively, an organic acid may be employed, and specific examples thereof include formic acid, acetic acid, propionic acid, malic acid, oxalic acid, malonic acid, succinic acid and tartaric acid. No rigorous limitation is imposed on the tackiness-imparting compound concentration, and the concentration may be appropriately adjusted upon use in accordance with solubility and use conditions. Preferably, the total tackiness-imparting compounds concentration falls within a range of 0.05 mass % to 20 mass % from the view point of handling upon use. When the concentration is lower than the range, complete formation of tacky film fails to be attained, which is not preferred in terms of performance.

The treatment is preferably performed under slightly heated conditions rather than at room temperature from the viewpoint of rate and amount of formed tacky film. The treatment temperature varies depending upon tackiness-imparting compound concentration, type of metal, etc. Generally, the temperature preferably falls within a range of 30° C. to 60° C. No particular limitation is imposed on the immersion time, and from the viewpoint of operational efficiency, the time is preferably controlled to fall within a range of 5 sec to 5 min through tuning of other conditions.

In this case, the solution preferably contains copper (in ion form) in an amount of 100 to 1,000 ppm, since efficiency of tacky film formation (e.g., formation rate or amount of formation) is enhanced.

In a preferred mode, the portion of a conductive circuit of the printed wiring board to be treated, which portion is not required to be soldered, is coated with a resist or a similar material to thereby expose only the circuit pattern. Then, the exposed area is treated with a tackiness-imparting compound solution.

In order to realize a tacky conductive circuit surface, the printed wiring board is immersed in the aforementioned tackiness-imparting compound solution, or the solution is applied onto the printed wiring board.

According to the present invention, a solder powder is placed in a vessel, a printed wiring board is placed in the vessel, and the vessel is tilted to thereby deposit the solder powder on the tackiness-imparted area of the wiring board. Through placement of solder powder in the vessel, flying off of the solder powder can be prevented. In addition, through tilting of the vessel so as to deposit the solder powder on the wiring board, release of the deposited solder powder is prevented. Thus, reliable deposition of the solder powder can be attained.

In the method for producing a solder circuit board of the present invention, the printed wiring board accommodated in the vessel may be disposed in a non-contact state by means of a jig or a similar device, whereby the solder powder can be deposited on both surfaces of the printed wiring board.

In the method for producing a solder circuit board of the present invention, a solder powder is placed in a vessel, a printed wiring board is placed in the vessel, and the vessel is vibrated to thereby deposit the solder powder on the tackiness-imparted area of the wiring board. Through employment of the procedure, flying off of the solder powder can be prevented.

In the above method for producing a solder circuit board of the present invention, the printed wiring board accommodated in the vessel may be disposed in a non-contact state by means of a jig or a similar device, whereby the solder powder can be deposited on both surfaces of the printed wiring board. In an alternative method, printed wiring boards are held in an upright posture along the flow direction of the solder powder layer or a solder suspension during tilting of the vessel, with the wiring boards being arranged in parallel with one another at predetermined intervals.

In the method for producing a solder circuit board of the present invention, the vessel is preferably a sealable vessel. Through employment of the vessel, flying off of the solder powder can be further prevented.

In the present invention, deposition of a solder powder onto the tackiness-imparted solder circuit board is preferably performed in liquid. Through performing deposition of the solder powder in liquid, there can be prevented deposition of the solder powder on a non-tacky area caused by static electricity and aggregation of the solder powder caused by static electricity. Thus, fine-pitch circuit boards and solder micropowder can be employed.

In the present invention, deposition of solder powder in liquid is preferably performed such that the solder powder is fluidized in liquid flow.

Upon deposition of solder powder present in liquid through tilting, the liquid preferably has a solder powder content of 0.5 vol. % to 10 vol. %, more preferably 3 vol. % to 8 vol. %.

In the present invention, deposition of solder powder is preferably performed in water. In order to prevent oxidation of solder powder by the liquid, a deoxygenized liquid or a liquid containing an anti-corrosive agent is preferably employed.

The solder powder deposition apparatus employed in the method for producing a solder circuit board of the present invention has a vessel for accommodating a solder powder and printed wiring boards; an inlet through which the printed wiring boards are introduced in a horizontal direction; a mechanism for preventing, through tilting of the vessel, contact between the wiring boards and the solder powder during introduction of the wiring boards into the vessel; and a mechanism for tilting or vibrating the vessel in a sealed or non-sealed state. Contact between the wiring boards and the solder powder during introduction of the wiring boards into the vessel is prevented through tilting of the vessel, since plugging a space between a jig and the wiring boards is prevented during placement of the wiring boards in the vessel, whereby reliable placement of the wiring boards can be performed.

The treatment method of the present invention is applicable not only to the aforementioned solder-precoated circuit boards, but also to other circuit boards having bumps for BGA (ball grid array) bonding, CSP (chip size package) bonding, etc. Needless to say, these circuit boards are included in the scope of the solder circuit board of the present invention.

Examples of the metal composition of the solder powder employed in the method for producing a solder circuit board of the present invention include Sn—Pb-based, Sn—Pb—Ag-based, Sn—Pb—Bi-based, Sn—Pb—Bi—Ag-based and Sn—Pb—Cd-based metals. From a recent Pb-free aspect of industrial wastes, examples of preferred solder compositions include Pb-free materials such as Sn—In-based, Sn—Bi-based, In—Ag-based, In—Bi-based, Sn—Zn-based, Sn—Ag-based, Sn—Cu-based, Sn—Sb-based, Sn—Au-based, Sn—Bi—Ag—Cu-based, Sn—Ge-based, Sn—Bi—Cu-based, Sn—Cu—Sb—Ag-based, Sn—Ag—Zn-based, Sn—Cu—Ag-based, Sn—Bi—Sb-based, Sn—Bi—Sb—Zn-based, Sn—Bi—Cu—Zn-based, Sn—Ag—Sb-based, Sn—Ag—Sb—Zn-based, Sn—Ag—Cu—Zn-based and Sn—Zn—Bi-based metals.

Specific examples of the above compositions include an eutectic solder of Sn (63 mass %) and Pb (37 mass %) (hereinafter abbreviated as 63Sn/37Pb) as a typical example, and 62Sn/36Pb/2Ag, 62.6Sn/37Pb/0.4Ag, 60Sn/40Pb, 50Sn/50Pb, 30Sn/70Pb, 25Sn/75Pb, 10Sn/88Pb/2Ag, 46Sn/8Bi/46Pb, 57Sn/3Bi/40Pb, 42Sn/42Pb/14Bi/2Ag, 45Sn/40Pb/15Bi, 50Sn/32Pb/18Cd, 48Sn/52In, 43Sn/57Bi, 97In/3Ag, 58Sn/42In, 95In/5Bi, 60Sn/40Bi, 91Sn/9Zn, 96.5Sn/3.5Ag, 99.3Sn/0.7Cu, 95Sn/5Sb, 20Sn/80Au, 90Sn/10Ag, 90Sn/7.5Bi/2Ag/0.5Cu, 97Sn/3Cu, 99Sn/1Ge, 92Sn/7.5Bi/0.5Cu, 97Sn/2Cu/0.8Sb/0.2Ag, 95.5Sn/3.5Ag/1Zn, 95.5Sn/4Cu/0.5Ag, 52Sn/45Bi/3Sb, 51Sn/45Bi/3Sb/1Zn, 85Sn/10Bi/5Sb, 84Sn/10Bi/5Sb/1Zn, 88.2Sn/10Bi/0.8Cu/1Zn, 89Sn/4Ag/7Sb, 88Sn/4Ag/7Sb/1Zn, 98Sn/1Ag/1Sb, 97Sn/1Ag/1Sb/1Zn, 91.2Sn/2Ag/0.8Cu/6Zn, 89Sn/8Zn/3Bi, 86Sn/8Zn/6Bi and 89.1Sn/2Ag/0.9Cu/8Zn. In the present invention, more solder powders having different compositions may be employed in combination of two or more species.

When the solder circuit board of the present invention is fabricated by use of, among others, a Pb-free solder, particularly preferably a solder alloy selected from Sn—Zn and Sn—Zn—Bi, reflow temperature can be lowered to a level almost equivalent to the reflow temperature when an Sn—Pb-based solder is employed. Therefore, the mounted parts have a prolonged service life, and a variety of parts may be mounted.

The thickness of the solder film can be regulated through changing the particle size of the solder powder. Therefore, the particle size of the solder powder is determined in accordance with the thickness of the solder coating layer to be provided. For example, the solder powder particles selected from among powders having particle sizes of 63 to 22 μm, 45 to 22 μm, and 38 to 22 μm, based on classification as stipulated by Japanese Industrial Standards (JIS), and balls having a size of 80 μm or more. Generally, the mean particle size of the solder powder of the present invention may be determined through a method as stipulated by JIS employing a standard sieve and a balance. Alternatively, microscopic image analysis, the electrozone method, or a method employing a Coulter counter may be employed. The principle of the Coulter counter is disclosed in "Powder Technology Handbook" (Edited by The Society of Powder Technology Japan, 2nd ed., p. 19 to p. 20). Specifically, a solution in which a powder is dispersed is caused to pass through micropores provided in a separator wall, and difference in electrical resistance between opposite sides of the micropores is measured, whereby the particle size of the powder is determined. Percent number of particles having a specific particle size can be determined at high reproducibility. The mean particle size of the solder powder of the present invention may be determined through the above method.

The solder circuit board produced according to the present invention is suitably adapted to a mounting method including a step of placing electronic parts and a step of bonding the electronic parts through reflowing a solder. For example, a solder paste is applied, through screen printing or a similar technique, onto an area of the solder circuit board produced according to the present invention, to which area an electronic part is to be bonded; the electronic part is placed; and the circuit board is heated so as to melt and solidify the solder powder contained in the solder paste, whereby the electronic part is bonded to the circuit board.

Bonding (mounting) of electronic parts onto a solder circuit board may be performed through, for example, the surface mounting technique (SMT). In the mounting technique, a solder circuit board is provided through the method of the present invention or printing of a solder paste. For example, the solder paste is applied onto a desired area of the circuit pattern. Subsequently, electronic parts such as chip elements and QFP which have been solder-deposited or reflowed through the method of the present invention are placed on the solder paste area of the circuit pattern, followed by solder-bonding all the electronic parts by means of a reflow heat source. Examples of reflow heat sources employed in the technique include a hot air furnace, an IR furnace, a vapor condensation soldering apparatus and a light beam soldering apparatus.

In the present invention, the reflow process is performed under conditions depending upon the solder alloy composition. When an Sn—Zn-based alloy such as 91Sn/9Zn, 89Sn/8Zn/3Bi or 86Sn/8Zn/6Bi is employed, two steps of preliminary heating and reflowing are preferably performed. In this case, preliminary heating is performed at 130 to 180° C., preferably 130 to 150° C., for 60 to 120 seconds, preferably 60 to 90 seconds. Reflowing is performed at 210 to 230° C., preferably 210 to 220° C., for 30 to 60 seconds, preferably 30 to 40 seconds. In cases where other alloys are employed, reflow temperature is +20 to +50° C. higher than the melting point of the alloy employed, preferably +20 to +30° C. higher than the melting point, and the same preliminary heating temperature, heating time and reflowing time as specified above may be employed.

The aforementioned reflow process may be performed under nitrogen or in air. When reflow is performed under nitrogen, the nitrogen atmosphere has an oxygen content of 5 vol. % or less, preferably 0.5 vol. % or less. Under such conditions, wettability of the solder with respect to the solder circuit is enhanced as compared with reflowing in air, and fewer solder balls are produced, ensuring reliable treatment.

Subsequently, the solder circuit board is cooled to thereby complete surface mounting. In the method for producing an electronic-part-bonded product through surface mounting, parts-bonding may be performed on opposite surfaces of a printed wiring board. No particular limitation is imposed on the electronic part which is used in the electronic parts mounting method of the present invention, and specific examples include LSIs, resistors, capacitors, transducers, inductors, filters, oscillators and vibrators.

The present invention will next be described in detail with reference to examples, which should not be construed as limiting the invention thereto.

Example 1

A printed wiring board having a minimum electrode gap of 50 μm was fabricated. The conductive circuit of the wiring board was formed from copper.

An imidazole compound represented by formula (3), in which the R12 alkyl group is $C_{11}H_{23}$ and R11 is a hydrogen atom, was employed in the form of 2 mass % aqueous solution, and the pH of the solution was adjusted to about 4 with acetic acid. The thus produced aqueous tackiness-imparting compound solution was heated to 40° C. The above printed wiring board which had been treated with an aqueous hydrochloric acid solution was immersed in the tackiness-imparting compound solution for three minutes, whereby a tacky substance was provided on the copper circuit.

Subsequently, the printed wiring board was placed into a solder powder deposition apparatus as shown in FIG. 1. The apparatus includes a vessel (inner dimensions: 250 mm×120 mm×120 mm) having an inlet through which the printed wiring board was to be introduced in a horizontal direction. Into the vessel, a solder powder (about 400 g) of 96.5Sn/3.5Ag (mean particle size: 20 μm, as determined by means of a MicroTrack) was introduced such that the solder powder deposition apparatus was tilted so as to prevent contact between the solder powder and the wiring board. After placement of the wiring board in the solder powder deposition apparatus, the vessel was tilted right and left at an angle of 30° for 10 seconds, whereby the solder powder was deposited on the printed wiring board. One cycle of tilting was determined to take 5 sec.

The printed wiring board was removed from the apparatus, and lightly washed with pure water, followed by drying the printed wiring board.

The printed wiring board was placed in an oven at 240° C. to thereby melt the solder powder, whereby a solder thin layer of 96.5Sn/3.5Ag was formed on an exposed area of the copper circuit in a thickness of about 20 μm. No conductor bridge or the like was formed in the solder circuit.

Example 2

Into the powder deposition apparatus employed in Example 1, solder balls (400 g) formed of 96.5Sn/3.5Ag and having a mean particle size of 80 μm and pure water (oxygen content: 1 ppm or less) (1.2 l) were added. A printed wiring board having an electrode diameter of 100 μm was introduced into the vessel of the apparatus, and the vessel was tilted right and left at an angle of 30°, whereby the solder powder was deposited on the printed wiring board.

Subsequently, a solder bump was formed through the same treatment as employed in Example 1, whereby a solder bump of 96.5Sn/3.5Ag was formed on an exposed area of the copper circuit in a thickness of about 50 μm.

INDUSTRIAL APPLICABILITY

In the method for producing an electronic circuit board including imparting tackiness to a surface of a metal-exposed area of a substrate board; depositing a solder powder on the tackiness-imparted area; and heating the printed wiring board so as to melt the solder to thereby form a solder circuit, even in a minute circuit pattern, short circuit between adjacent traces, which would otherwise be caused by solder metal, can be effectively prevented, whereby reliability of the produced solder circuit board is remarkably enhanced. As a result, there can be realized a small-size, high-reliability circuit board which has a minute circuit pattern and on which electronic parts having remarkably enhanced reliability are mounted. Thus, the invention provides an electronic circuit board, a high-reliability electronic-part-mounted circuit board which realizes high mounting density, and electronics devices of excellent characteristics.

The invention claimed is:

1. A method for producing a solder circuit board comprising the steps of:
    imparting tackiness to a surface of a conductive circuit electrode provided on a printed wiring board to form a tackiness-imparted area;
    depositing solder powder on the tackiness-imparted area; and
    heating the printed wiring board so as to melt the solder to thereby form a solder circuit;
    wherein the solder powder is dispersed in a liquid in a vessel, the printed wiring board having the electrode whose surface has been imparted with tackiness is placed in the vessel in a horizontal direction, and the vessel is cyclically tilted right and left to thereby deposit the solder powder on the tackiness-imparted area.

2. A method for producing a solder circuit board according to claim 1, wherein the vessel is tilted right and left so that the solder powder is brought into contact with both surfaces of the printed wiring board to thereby deposit the solder powder on the tackiness-imparted area.

3. A method for producing a solder circuit board according to claim 1 comprising the step of:
    vibrating the vessel to thereby deposit the solder powder on the tackiness-imparted area.

4. A method for producing a solder circuit board according to claim 3, wherein the vessel is vibrated so that the solder powder is brought into contact with both surfaces of the printed wiring board to thereby deposit the solder powder on the tackiness-imparted area.

5. A method for producing a solder circuit board according to claim 1, wherein the vessel is a sealable vessel.

6. A method for producing a solder circuit board according to claim 1, wherein the liquid is a deoxygenated liquid.

7. A method for producing a solder circuit board according to claim 1, wherein the method employs a solder powder deposition apparatus; the apparatus comprising a vessel for accommodating a solder powder and printed wiring boards, an inlet through which the printed wiring boards are introduced into the vessel, a mechanism for preventing, through tilting of the vessel, contact between the wiring boards and the solder powder during introduction of the wiring boards into the vessel, and a mechanism for tilting or vibrating the vessel in a sealed or non-sealed state; the printing wiring boards are held in an upright posture in the solder powder deposition apparatus, with the wiring boards being arranged in parallel with one another at predetermined intervals, and the vessel is tilted so as to prevent contact between the solder powder and the wiring boards, tilting of the vessel is reversed, to thereby bring the solder powder into contact with the wiring boards, and the vessel is tilted or vibrated.

* * * * *